(12) United States Patent
Yao et al.

(10) Patent No.: US 8,551,686 B2
(45) Date of Patent: Oct. 8, 2013

(54) ANTIREFLECTIVE COMPOSITION FOR PHOTORESISTS

(75) Inventors: Huirong Yao, Plainsboro, NJ (US); Guanyang Lin, Whitehouse Station, NJ (US); Mark O. Neisser, Whitehouse Station, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 722 days.

(21) Appl. No.: 12/609,222

(22) Filed: Oct. 30, 2009

(65) Prior Publication Data

US 2011/0104613 A1    May 5, 2011

(51) Int. Cl.
G03F 7/11    (2006.01)
G03F 7/38    (2006.01)
G03F 7/40    (2006.01)
C09D 167/00  (2006.01)
H01L 21/027  (2006.01)

(52) U.S. Cl.
USPC ........ 430/271.1; 430/311; 430/325; 430/326; 430/323; 525/418

(58) Field of Classification Search
None
See application file for complete search history.

(56) References Cited

U.S. PATENT DOCUMENTS

| | | | |
|---|---|---|---|
| 3,215,758 A | 11/1965 | Hopkins | |
| 3,279,940 A | 10/1966 | Francis et al. | |
| 3,448,084 A | 6/1969 | Burdick et al. | |
| 3,474,054 A | 10/1969 | White | |
| 3,477,996 A | 11/1969 | Formaini | |
| 4,200,729 A | 4/1980 | Calbo | |
| 4,251,665 A | 2/1981 | Calbo | |
| 4,255,299 A * | 3/1981 | Daimon et al. | 524/32 |
| 4,309,529 A | 1/1982 | Wendling | |
| 4,491,628 A | 1/1985 | Ito et al. | |
| 5,187,019 A | 2/1993 | Calbo et al. | |
| 5,350,660 A | 9/1994 | Urano et al. | |
| 5,843,624 A | 12/1998 | Houlihan et al. | |
| 5,935,760 A | 8/1999 | Shao et al. | |
| 6,447,980 B1 | 9/2002 | Rahman et al. | |
| 6,723,488 B2 | 4/2004 | Kudo et al. | |
| 6,790,587 B1 | 9/2004 | Feiring et al. | |
| 6,818,258 B2 | 11/2004 | Kaneko et al. | |
| 6,849,377 B2 | 2/2005 | Feiring et al. | |
| 6,866,984 B2 | 3/2005 | Jung et al. | |
| 6,916,590 B2 | 7/2005 | Kaneko et al. | |
| 7,081,511 B2 | 7/2006 | Wu et al. | |
| 7,264,913 B2 | 9/2007 | Wu et al. | |
| 7,470,500 B2 | 12/2008 | Yao et al. | |
| 7,638,262 B2 | 12/2009 | Wu et al. | |
| 7,691,556 B2 | 4/2010 | Wu et al. | |
| 7,846,638 B2 | 12/2010 | Kishioka et al. | |
| 2004/0253203 A1 | 12/2004 | Hossainy et al. | |
| 2005/0234201 A1 * | 10/2005 | Wu et al. | 525/437 |
| 2007/0141507 A1 | 6/2007 | Sakata et al. | |
| 2007/0269720 A1 * | 11/2007 | Demachi et al. | 430/4 |
| 2008/0038659 A1 * | 2/2008 | Wu et al. | 430/270.1 |
| 2008/0175882 A1 | 7/2008 | Trollsas et al. | |
| 2010/0009293 A1 | 1/2010 | Yao et al. | |
| 2010/0256285 A1 | 10/2010 | Zhao et al. | |

FOREIGN PATENT DOCUMENTS

| | | |
|---|---|---|
| CA | 1 204 547 A1 | 5/1986 |
| JP | 1-293339 A | 11/1989 |

OTHER PUBLICATIONS

Form PCT/ISA/220, Form PCT/ISA/210, and Form PCT/ISA/237 for date mailed Feb. 1, 2011 for PCT/IB/2010/002784, which corresponds to U.S. Appl. No. 12/609,222.

Shun-ichi Kodama et al., "Synthesis of Novel Fluoropolymer for 157nm Photoresists by Cycho-polymerization", SPIE vol. 4690, pp. 76-83 (2002).

Final Office Action mail date Jan. 5, 2012 for U.S. Appl. No. 12/133,562.

Notice of Allowance and Fee(s) Due mail date Mar. 15, 2012 for U.S. Appl. No. 12/133,562.

(Continued)

*Primary Examiner* — Cynthia Hamilton
(74) *Attorney, Agent, or Firm* — Sangya Jain

(57) ABSTRACT

The invention relates to an antireflective coating composition for a photoresist layer comprising a polymer, a crosslinking agent and an acid generator, where the polymer comprises at least one unit of structure 1,

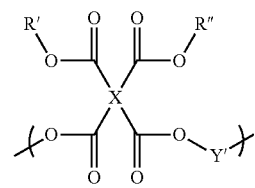

(1)

where, X is a linking moiety selected from a nonaromatic (A) moiety, aromatic (P) moiety and mixture thereof, R' is a group of structure (2), R" is independently selected from hydrogen, a moiety of structure (2), Z and W—OH, where Z is a ($C_1$-$C_{20}$) hydrocarbyl moiety and W is a ($C_1$-$C_{20}$) hydrocarbylene linking moiety, and, Y' is independently a ($C_1$-$C_{20}$) hydrocarbylene linking moiety, where structure (2) is

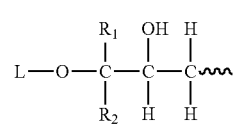

(2)

where $R_1$ and $R_2$ are independently selected from H and $C_1$-$C_4$alkyl and L is an organic hydrocarbyl group. The invention further relates to a process for imaging the antireflective coating composition.

15 Claims, 6 Drawing Sheets

(56) References Cited

OTHER PUBLICATIONS

Communication under Rule 71(3) EPC (EPO Form 2004) dated Mar. 16, 2012 for EP 09 785 890.6, which corresponds to U.S. Appl. No. 12/133,562.
Form PCT/IB/326, Form PCT/IB/373, and Form PCT/ISA/237 for PCT/IB2010/002784 mail date May 10, 2012, which corresponds to U.S. Appl. No. 12/609,222.
English Language Abstract of JP 1-293339 A, downloaded Jun. 8, 2011.
Form PCT/ISA/220, Form PCT/ISA/210, and Form PCT/ISA/237 for PCT/IB2007/002340 mail date Jan. 25, 2008, which corresponds to U.S. Appl. No. 11/502,706.
Form PCT/IB/326, Form PCT/IB/373, and Form PCT/ISA/237 for PCT/IB2007/002340 mail date Feb. 19, 2009, which corresponds to U.S. Appl. No. 11/502,706.
Office Action dated Mar. 2, 2010 for EP 07789633.0, which corresponds to U.S. Appl. No. 11/502,706.
Form PCT/ISA/220, Form PCT/ISA/210, and Form PCT/ISA/237 for PCT/IB2009/005458 mail date Aug. 4, 2009, which corresponds to U.S. Appl. No. 12/133,562.
JForm PCT/IB/326, Form PCT/IB/373, and Form PCT/ISA/237 for PCT/IB2009/005458 mail date Aug. 4, 2009, which corresponds to U.S. Appl. No. 12/133,562.
Jerry March, Advanced Organic Chemistry: Reactions, Mechanisms, and Structure, second edition, McGraw Hill Book Company, New York, NY, 1977 (no month), pp. 41-69.
Marvel et al., "Polythiolesters", J. of Am. Chem. Soc. vol. 73, No. 3, pp. 1100-1102, Year 1951.
178586 Bicyclo[2.2.2]oct-7ene-2,3,5,6-tetracarboxyl dianhydride, from www.sigma-aldrich.com; catalog/search product Detail/ ALDRICH/178586, printed out Oct. 24, 2007, three page.
Office Action mail date Jan. 25, 2010 for U.S. Appl. No. 12/133,562.
Office Action mail date Mar. 30, 2010 for U.S. Appl. No. 12/133,562.
Office Action mail date Oct. 13, 2010 for U.S. Appl. No. 12/133,562.
Office Action mail date Jan. 11, 2011 for U.S. Appl. No. 12/133,562.
Office Action issued Apr. 10, 2012 from the Japanese Patent Office for Japanese Patent Application 2009-523369, which corresponds to U.S. Appl. No. 11/502,706.
Eng. Lang. Trans. of the Office Action issued Apr. 10, 2012 from the Japanese Patent Office for Japanese Patent Application 2009-523369, which corresponds to U.S. Appl. No. 11/502,706.
Office Action mail date Jul. 18, 2011 for U.S. Appl. No. 12/133,562.
Communication pursuant to Article 94(3) EPC (EPO Form 2001) dated Jun. 20, 2011 for EP 09 785 890.6, which corresponds to U.S. Appl. No. 12/133,562.
Communication pursuant to article 94(3) EPC—EPO Form 2001 dated Mar. 11, 2013 for EP10796469.4, which corresponds to U.S. Appl. No. 12/609,222.

\* cited by examiner

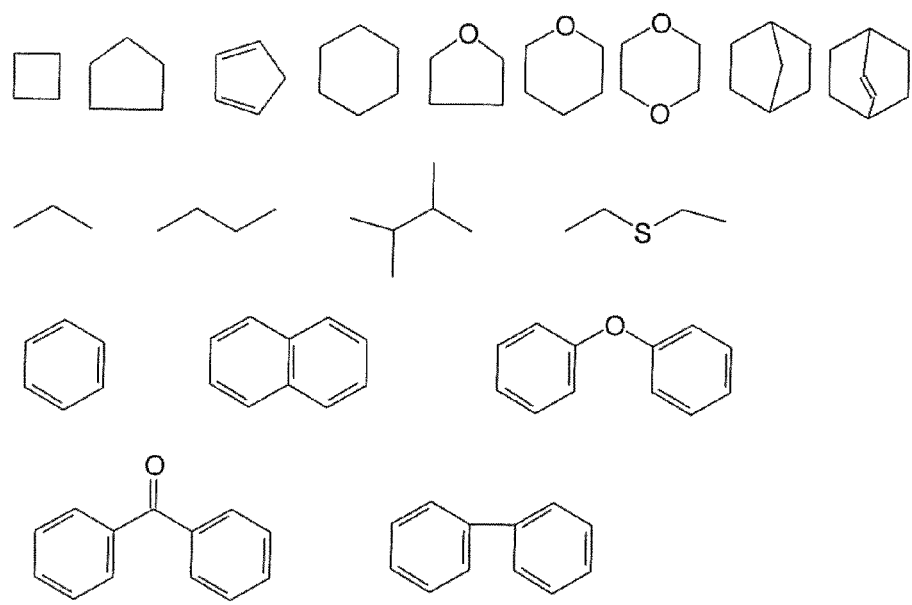
Figure 1: Examples of the linking moiety X

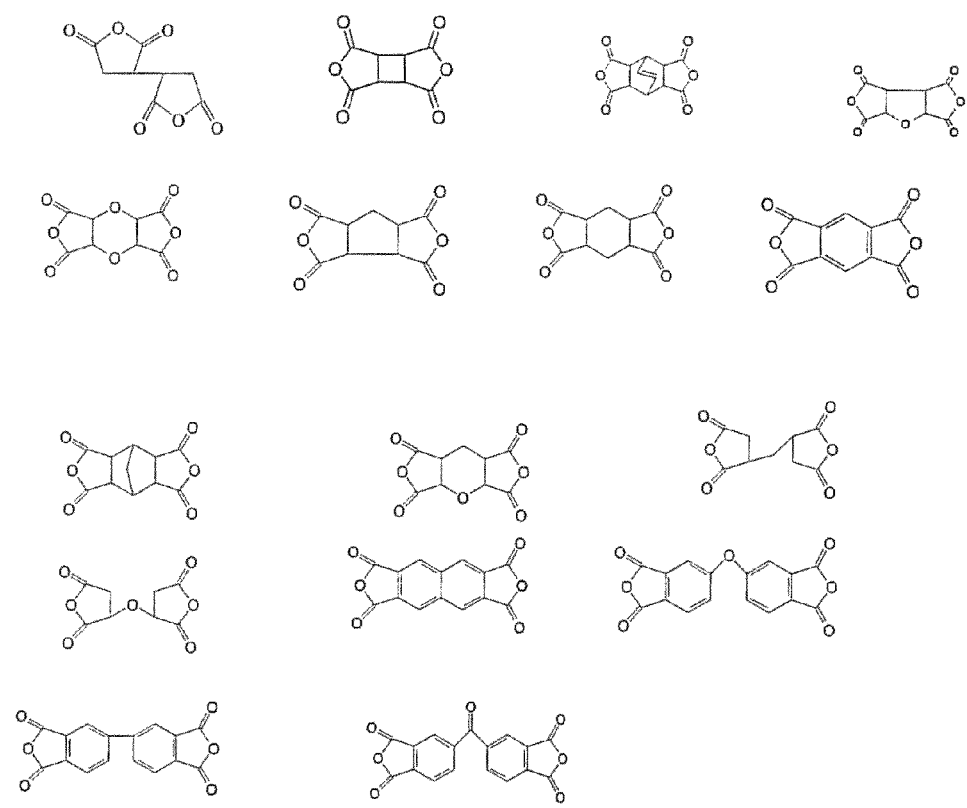
Figure 2: Examples of dianhydrides

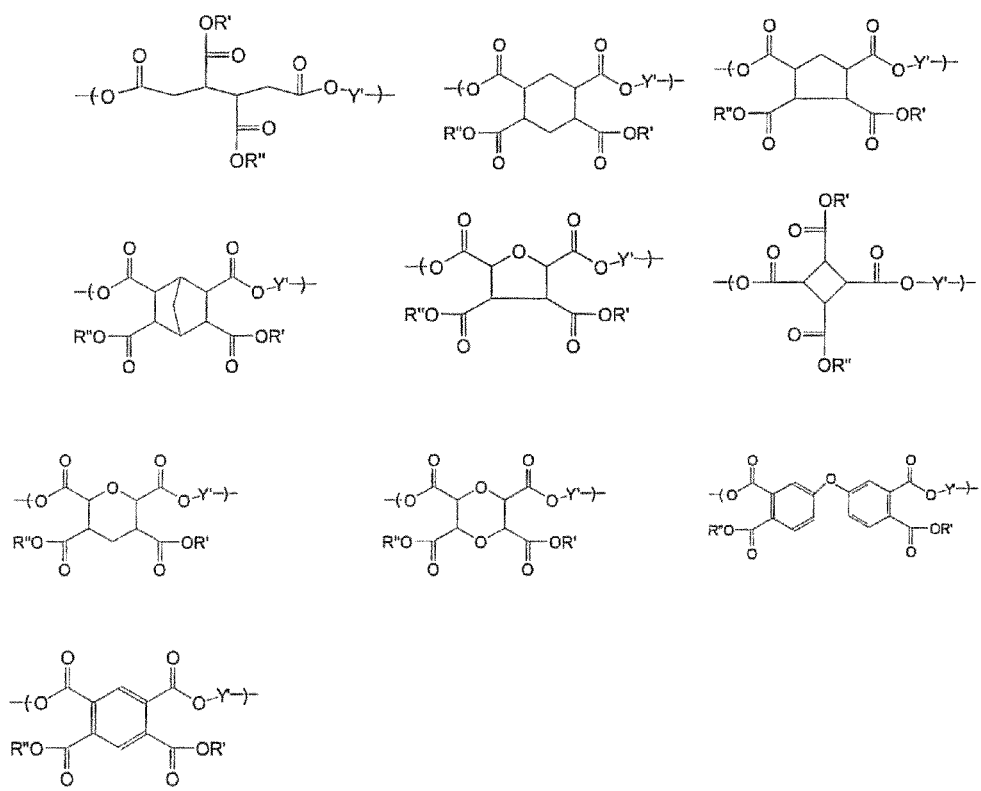
Figure 3: Examples of polymer unit of Structure (1)

Figure 4: Further examples of polymer unit of Structure (1)
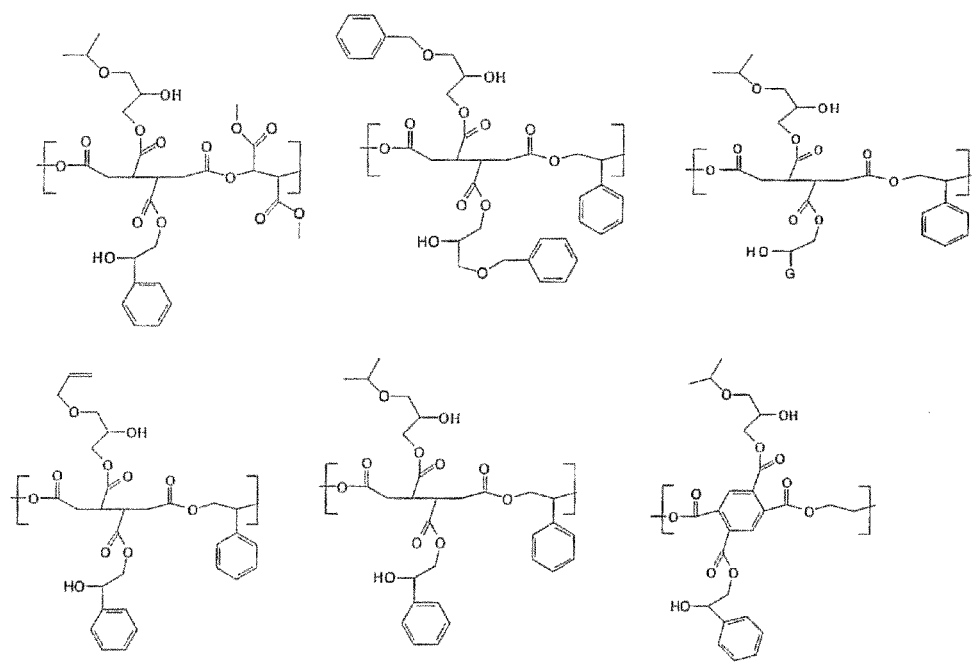

Figure 5: Further more examples of polymer unit of Structure (1)
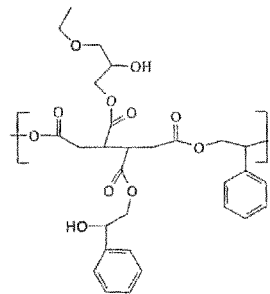
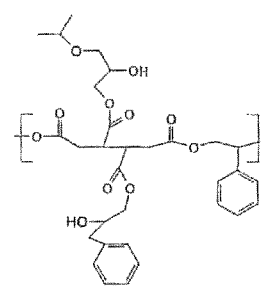
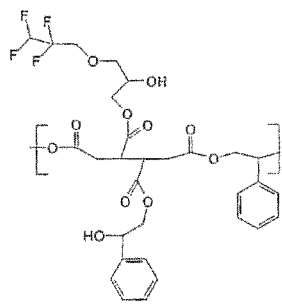
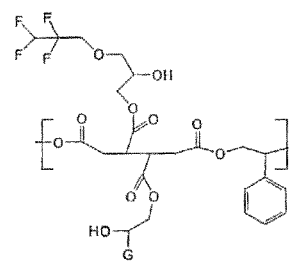
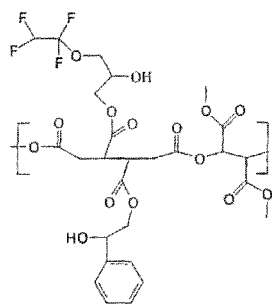
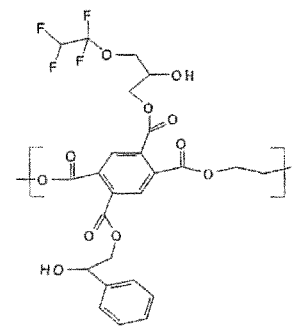

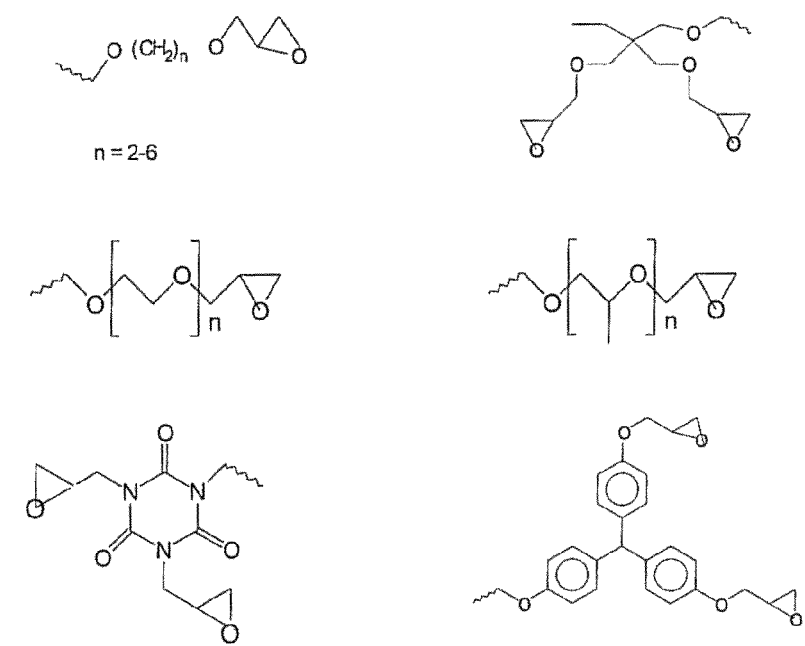
Figure 6: Example of "G" group containing epoxide for Fig. 4 and 5

ANTIREFLECTIVE COMPOSITION FOR PHOTORESISTS

FIELD OF INVENTION

The present invention relates to a novel antireflective coating composition and its use in image processing by forming a thin layer of the novel antireflective coating composition between a reflective substrate and a photoresist coating. Such compositions are particularly useful in the fabrication of semiconductor devices by photolithographic techniques.

BACKGROUND

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

The use of highly absorbing antireflective coatings in photolithography is one approach to diminish the problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes. Reflective notching becomes severe as the photoresist is patterned over substrates containing topographical features, which scatter light through the photoresist film, leading to line width variations, and in the extreme case, forming regions with complete photoresist loss.

In cases where further reduction or elimination of line width variation is required, the use of bottom antireflective coating provides the best solution for the elimination of reflectivity. The bottom antireflective coating is applied to the substrate prior to coating with the photoresist and prior to exposure. The photoresist is exposed imagewise and developed. The antireflective coating in the exposed area is then etched, typically in gaseous plasma, and the photoresist pattern is thus transferred to the substrate. The etch rate of the antireflective film should be relatively high in comparison to the photoresist so that the antireflective film is etched without excessive loss of the photoresist film during the etch process. Antireflective coatings must also possess the correct absorption and refractive index at the wavelength of exposure to achieve the desired lithographic properties.

It is necessary to have a bottom antireflective coating that functions well at exposures less than 300 nm. Such antireflective coatings need to have high etch rates and be sufficiently absorbing with the correct refractive index to act as antireflective coatings.

The novel antireflective coatings of the present invention, comprising a novel polyester polymer based on a unique chemical structure, have been found to have good dry etching properties, which enable a good image transfer from the photoresist to the substrate, and also good absorption characteristics to prevent reflective notching and line width variations or standing waves, particularly at 193 nm. The antireflective coating of the present invention has a relatively high etch rate such that the antireflective coating is removed with minimal loss in the thickness of the photoresist layer. Additionally, substantially no intermixing is present between the antireflective coating and the photoresist film. The antireflective coatings also have good solution stability and form particularly thin films with good coating quality, the latter being particularly advantageous for lithography. When the antireflective coating is used with a photoresist in the imaging process, clean images are obtained with good lithographic properties.

BRIEF DESCRIPTION OF DRAWINGS

FIG. 1 shows examples of the linking moiety A and P.

FIG. 2 illustrates examples of aliphatic and aromatic dianhydrides.

FIG. 3 gives examples of polymer unit of Structure (1).

FIG. 4 gives more examples of polymer unit of Structure (1).

FIG. 5 gives more examples of polymer unit of Structure (1).

FIG. 6 gives examples of capping units containing epoxy groups

SUMMARY

The invention relates to an antireflective coating composition for a photoresist layer comprising a polymer, a crosslinking agent and an acid generator, where the polymer comprises at least one unit of structure 1,

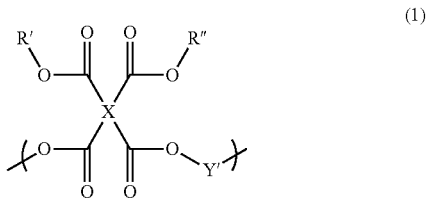

where, X is a linking moiety selected from a nonaromatic (A) moiety, aromatic (P) moiety and mixture thereof, R' is a group of structure (2), R" is independently selected from hydrogen, a moiety of structure (2), Z and W—OH, where Z is a ($C_1$-$C_{20}$) hydrocarbyl moiety and W is a ($C_1$-$C_{20}$) hydrocarbylene linking moiety, and, Y' is independently a ($C_1$-$C_{20}$) hydrocarbylene linking moiety, where structure (2) is

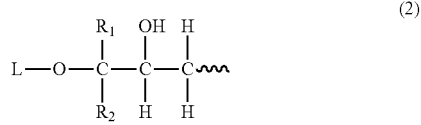

where $R_1$ and $R_2$ are independently selected from H and $C_1$-$C_4$ alkyl and L is an organic hydrocarbyl group.

The invention further relates to a process for imaging the antireflective coating composition.

DESCRIPTION OF THE INVENTION

The present invention relates to a novel antireflective coating composition comprising a polymer, a crosslinking agent and an acid generator. The present invention further relates to a process for using the novel composition, particularly at 193 nm and 248 nm. The polymer of the present invention contains at least one unit selected from structure (1)

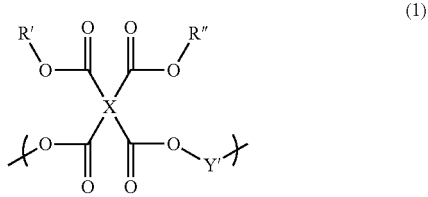

(1)

where, X is a linking moiety selected from a nonaromatic (A) moeity, aromatic (P) moeity and mixture thereof, R' is a group of structure (2), R" is independently selected from hydrogen, a moiety of structure (2), Z and W—OH, where Z is a ($C_1$-$C_{20}$) hydrocarbyl moiety and W is a ($C_1$-$C_{20}$) hydrocarbylene linking moiety, and, Y' is independently a ($C_1$-$C_{20}$) hydrocarbylene linking moiety, where structure (2) is

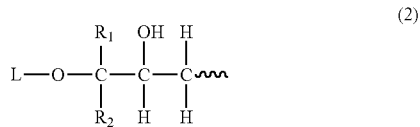

(2)

where $R_1$ and $R_2$ is selected from H and $C_1$-$C_4$alkyl and L is an organic hydrocarbyl group such as selected from alkyl, aryl, aralkyl, fluorinated alkyl, organic epoxide, cyanourate, aralkylallyl, alklylenearyl, and mixtures thereof, ∿∿∿ is a bond which attaches the group of structure (2) to the unit of structure (1), further where R' and R" can be the same or different.

Examples of structure (2) can be methoxy propanol, ethoxy propanol, propoxy propanol, butoxy propanol, allyl propanol ether, benzyl propanol ether, phenyl propanol ether, tetrafluoropropyl propanol ether, tertafluoroethyl propanol ether, octafluoropentyl propanol ether and the like. Examples of W—OH can be methanol, ethanol, propanol, isopropanol, 1-butanol, isobutanol, 2-methyl-2-butanol, 2-methyl-1-butanol, 3-methyl-1-butanol, tertiary butanol, cyclopentanol, cyclohexanol, 1-hexanol, 1-heptanol, 2-heptanol, 3-heptanol, 1-n-octanol, 2-n-octanol, 1-phenyl-1-ethanol, 1-phenyl-2-propanol, methoxy propanol, ethoxy propynol, propoxy propanol, allyl propanol ether, benzyl propanol ether, phenyl propanol ether, tetrafluoropropyl propanol ether, tertafluoroethyl propanol ether, octafluoropentyl propanol ether and the like.

In the polymer of the present composition, X is a linking moiety selected from a nonaromatic A moeity, aromatic P moeity and mixture thereof that connect the 4 carboxyl (C(O)O) groups in structure (1). The group A may also be defined as a nonaromatic aliphatic group. In one embodiment A is selected from $C_1$-$C_{20}$ unsubstituted alkylene, $C_1$-$C_{20}$ substituted alkylene, $C_1$-$C_{20}$ unsubstituted cycloaliphatic, $C_1$-$C_{20}$ substituted cycloaliphatic, $C_1$-$C_{20}$ unsubstituted heterocycloaliphatic, and $C_1$-$C_{20}$ substituted heterocycloaliphatic. Some examples of A are given in FIG. 1. In another embodiment A is selected from $C_4$-$C_{10}$ unsubstituted alkylene, a $C_4$-$C_{10}$ substituted alkylene, $C_1$-$C_{20}$ unsubstituted heterocycloaliphatic, and $C_1$-$C_{20}$ substituted heterocycloaliphatic. An example is bicyclo[2.2.2]oct-7-ene-2,3,5,6-tetracarboxylic dianhydride. In yet another embodiment A is selected from $C_4$-$C_{10}$ unsubstituted alkylene and a $C_4$-$C_{10}$ substituted alkylene. In yet another embodiment A is butylene. Typically a polymer is obtained by reacting at least one aliphatic dianhydride with at least one diol. The resulting polymer may be further reacted with an end capping reactant to cap one or more of the free acid groups. Examples of the aliphatic dianhydrides which upon polymerization form A, are given in FIG. 2.

In the polymer of the present composition P in Structure (1) is a aromatic group or a aromatic linking moiety that connects the 4 carboxyl (C(O)O) groups. In one embodiment P is selected from $C_6$-$C_{20}$ unsubstituted aromatic ring and $C_6$-$C_{20}$ substituted aromatic structures. Examples of aromatic dianhydrides are pyromellitic dianhydride, 3,6-diphenylpyromellitic dianhydride, 3,6-bis(trifluoromethyl)pyromellitic dianhydride, 3,6-bis(methyl)pyromellitic dianhydride, 3,6-diiodopyromellitic dianhydride, 3,6-dibromopyromellitic dianhydride, 3,6-dichloropyromellitic dianhydride, 3,3',4,4'-benzophenonetetracarboxylic acid dianhydride, 2,3,3',4'-benzophenonetetracarboxylic acid dianhydride, 2,2',3,3'-benzophenone tetracarboxylic acid dianhydride, 3,3',4,4'-biphenyltetracarboxylic acid dianhydride, 2,3,3'4'-biphenyltetracarboxylic acid dianhydride, 2,2',3,3'-biphenyltetracarboxylic acid dianhydride, 2,2',6,6'-biphenyltetracarboxylic acid dianhydride, bis(2,3-dicarboxyphenyl)methane dianhydride, bis(2,5,6-trifluoro-3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, bis(3,4-dicarboxyphenyl)ether dianhydride (4,4'-oxydiphthalic dianhydride), bis(3,4-dicarboxyphenyl) sulfone dianhydride (3,3',4,4'-diphenylsulfonetetracarboxylic dianhydride), 4,4'-[4,4'-isopropylidene-di(p-phenyleneoxy)]bis(phthalic anhydride), N,N-(3,4-dicarboxyphenyl)-N-methylamine dianhydride, bis(3,4-dicarboxyphenyl)diethylsilane dianhydride; 2,3,6,7-naphthalene tetracarboxylic acid dianhydride, 1,2,5,6-naphthalene-tetracarboxylic acid dianhydride, 1,4,5,8-naphthalenetetracarboxylic acid dianhydride, 2,6-dichloronaphthalene-1,4,5,8-tetracarboxylic acid dianhydride, thiophene-2,3,4,5-tetracarboxylic acid dianhydride, pyrazine-2,3,5,6-tetracarboxylic acid dianhydride, pyridine-2,3,5,6-tetracarboxylic acid dianhydride, 2,3,9,10-perylene tetracarboxylic acid dianhydride, 4,4'-(1,4-phenylene) bis(phthalic acid) dianhydride, 4,4'-(1,3-phenylene) bis(phthalic acid) dianhydride, 4,4'-oxydi(1,4-phenylene)bis (phthalic acid)dianhydride, 4,4'-methylenedi(1,4-phenylene) bis(phthalic acid)dianhydride, hydroquinonediether dianhydride, and 4,4'-biphenoxy dianhydride. Examples of the aromatic dianhydrides that upon polymerization form P are given in FIG. 2.

Typically a polymer is obtained by reacting at least one dianhydride with at least one diol. The resulting polymer may be further reacted with an end capping reactant to cap at least one of the free acid groups.

In one embodiment of the polymer of the composition, the polymer is represented by only one or more aliphatic A moiety. In one embodiment the polymer comprises at least one unit of Structure 3,

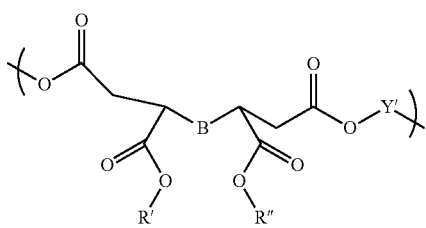

(3)

where, B is a single bond or $C_1$-$C_6$ nonaromatic aliphatic moiety, R' is the group with structure (2) as described herein, and R" is independently selected from hydrogen, group of structure (2), Z and W—OH, where Z is a ($C_1$-$C_{20}$) hydrocarbyl moiety and W is a ($C_1$-$C_{20}$) hydrocarbylene linking moiety, and, Y' is independently a ($C_1$-$C_{20}$) hydrocarbylene linking moiety. In one embodiment B is selected from a single bond and a $C_1$-$C_6$ alkylene which may be linear or branched. In another embodiment B is a single bond.

Examples of the polymeric unit of structure (1) are given in FIG. 3-5, where, R' is selected from structure (2).

The polymer may be derived from at least one dianhydride and may include aliphatic (A) and or/aromatic (P) dianhydrides. One or a mixture of diols may be used to react with the dianhydride(s) to form the polymer. The free acid is then end capped with a capping compound. At least one of the free acid groups is end capped. In one embodiment both carboxyl groups are end capped. Examples of aromatic dianhydrides are pyromellitic dianhydride, 3,6-diphenylpyromellitic dianhydride, 3,6-bis(trifluoromethyl)pyromellitic dianhydride, 3,6-bis(methyl)pyromellitic dianhydride, 3,6-diiodopyromellitic dianhydride, 3,6-dibromopyromellitic dianhydride, 3,6-dichloropyromellitic dianhydride, 3,3',4,4'-benzophenonetetracarboxylic acid dianhydride, 2,3,3',4'-benzophenonetetracarboxylic acid dianhydride, 2,2',3,3'-benzophenone tetracarboxylic acid dianhydride, 3,3',4,4'-biphenyltetracarboxylic acid dianhydride, 2,3,3'4'-biphenyltetracarboxylic acid dianhydride, 2,2',3,3'-biphenyltetracarboxylic acid dianhydride, 2,2',6,6'-biphenyltetracarboxylic acid dianhydride, bis(2,3-dicarboxyphenyl)methane dianhydride, bis(2,5,6-trifluoro-3,4-dicarboxyphenyl)methane dianhydride, 2,2-bis(3,4-dicarboxyphenyl)propane dianhydride, 2,2-bis(3,4-dicarboxyphenyl)-1,1,1,3,3,3-hexafluoropropane dianhydride, bis(3,4-dicarboxyphenyl)ether dianhydride (4,4'-oxydiphthalic dianhydride), bis(3,4-dicarboxyphenyl) sulfone dianhydride (3,3',4,4'-diphenylsulfonetetracarboxylic dianhydride), 4,4'-[4,4'-isopropylidene-di(p-phenyleneoxy)]bis(phthalic anhydride), N,N-(3,4-dicarboxyphenyl)-N-methylamine dianhydride, bis(3,4-dicarboxyphenyl)diethylsilane dianhydride; 2,3,6,7-naphthalene tetracarboxylic acid dianhydride, 1,2,5,6-naphthalene-tetracarboxylic acid dianhydride, 1,4,5,8-naphthalenetetracarboxylic acid dianhydride, 2,6-dichloronaphthalene-1,4,5,8-tetracarboxylic acid dianhydride, thiophene-2,3,4,5-tetracarboxylic acid dianhydride, pyrazine-2,3,5,6-tetracarboxylic acid dianhydride, pyridine-2,3,5,6-tetracarboxylic acid dianhydride, 2,3,9,10-perylene tetracarboxylic acid dianhydride, 4,4'-(1,4-phenylene) bis(phthalic acid) dianhydride, 4,4'-(1,3-phenylene) bis(phthalic acid) dianhydride, 4,4'-oxydi(1,4-phenylene)bis (phthalic acid)dianhydride, 4,4'-methylenedi(1,4-phenylene) bis(phthalic acid)dianhydride, hydroquinonediether dianhydride, and 4,4'-biphenoxy dianhydride In the polymer of the present invention, Y' is a hydrocarbyl moiety. Typically Y' is derived from the diol reactant to form the polymer. More than one type of diol may be used to form the polymer Examples of end capping reactants are epoxides to give structure (2), such as aliphalic glycidyl ether, aromatic glycidyl ether, fluorinated glycidyl ether. Examples include methyl glycidyl ether, ethyl glycidyl ether, propyl glycidyl ether, isopropyl glycidyl ether, butyl glycidyl ether, decyl glycidyl ether, and dodecyl glycidyl ether, allyl glycidyl ether, glycidyl 1,1,2,2-tetrafluoroethyl ether, glycidyl 2,2,3,3-tetrafluoropropyl ether, glycidyl 2,2,3,3,4,4,5,5-octafluoropentyl ether.

As used herein and throughout the application, the term "hydrocarbyl" or "hydrocarbylene" or "hydrocarbyl substituent" or "hydrocarbyl group" or "hydrocarbyl linking moiety" or "hydrocarbyl moeity" is used in its ordinary sense, which is well-known to those skilled in the art. Specifically, it refers to an organic group having carbon atom(s) directly attached to the molecule and having hydrocarbon character with optionally some heteroatoms. Hydrocarbylene refers to a hydrocarbyl group with 2 points of attachments to other groups. Examples of hydrocarbyl groups include:

(1) hydrocarbon groups, that are, aliphatic linear or branched (e.g., alkyl, alkylenyl or alkenyl or alkylene), aliphatic alicyclic (e.g., cycloalkyl, cycloalkenyl or cycloalkylene), aromatic, aliphatic- and alicyclic-substituted aromatic substituents, as well as cyclic substituents wherein the ring is completed through another portion of the molecule (e.g., two substituents together form an alicyclic radical);

(2) hydrocarbon groups that contain atoms other than carbon and hydrogen but are predominantly hydrocarbon in nature, where examples of other atoms are sulfur, oxygen or nitrogen, which may be present alone (such as thia or ether) or as functional linkages such as ester, carboxyl, carbonyl, cyclic ether, etc.;

(3) substituted hydrocarbon groups, that is, substituents containing non-hydrocarbon groups which, in the context of this invention, do not alter the predominantly hydrocarbon substituent (e.g., halo (especially chloro and fluoro), hydroxy, alkoxy, mercapto, alkylmercapto, nitro, nitroso, and sulfoxy);

(4) hetero substituents, that is, substituents which, while having a predominantly hydrocarbon character, in the context of this invention, contain other than carbon in a ring or chain otherwise composed of carbon atoms. Heteroatoms include sulfur, oxygen, nitrogen, and encompass substituents as pyridyl, furyl, thienyl and imidazolyl. In general, no more than two, preferably no more than one, non-hydrocarbon substituent will be present for every ten carbon atoms in the hydrocarbyl group.

Examples of hydrocarbyl groups are substituted or unsubstituted aliphatic ($C_1$-$C_{20}$) alkylene group, substituted or unsubstituted aliphatic ($C_1$-$C_{20}$) alkyl group, substituted or unsubstituted aliphatic ($C_1$-$C_{20}$) cycloalkyl group, substituted or unsubstituted thia-alkylene aliphatic ($C_1$-$C_{20}$) group, substituted or unsubstituted cycloalkylene, substituted or unsubstituted benzyl, alkoxy alkylene, alkoxyaryl, aryl, substituted aryl, substituted or unsubstituted aliphatic ($C_1$-$C_{20}$) alkylenearyl, hetero cycloalkylene, heteroaryl, oxocyclohexyl, cyclic lactone, hydroxy alkyl, hydroxyalkoxyl, alkoxy alkyl, alkoxyaryl, alkylaryl, alkenyl, aryl esters, esters with aromatic substituents, hetero cycloalkyl, heteroaryl, nitroalkyl, haloalkyl, alkylimide, alkyl amide, or mixtures thereof.

In the above definitions and throughout the present application, aliphatic refers to a predominantly hydrocarbon chain which is nonaromatic. Aliphatic may be linear, branched, cyclic or mixtures of thereof. Substituted or unsubstituted alkylene or thiaalkylene ($C_1$-$C_{20}$) group means an alkylene or a thiaalkylene group which is predominantly a hydrocarbon chain that may be linear or branched containing up to 20 carbon atoms, and where the substituents are those which do not typically change the hydrocarbon nature of the chain and may be all organic compounds known to those of ordinary skill in the art, such as ether, alkyl, ester, hydroxyl, alkynol, cyano, nitro, acyl, halogen (chloro or bromo), phenyl and substituted phenyl. A thiaalkylene group contains one or more sulfur groups in the chain. An example of aliphatic substituted or unsubstituted thia-alkylene ($C_1$-$C_{20}$) group is without limitation, 3,6-dithia-1,8-octylene.

In the above definitions and throughout the present specification, unless otherwise stated the terms used are described below.

Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n- or iso-propyl, n-,iso, or tert-butyl, linear or branched pentyl, hexyl, heptyl, octyl, decyl, dodecyl, tetradecyl and hexadecyl. Unless otherwise stated, alkyl refers to 1-20 carbon atom moiety. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicycle[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.2,9]undecane, tricyclo[4.2.1.2.7,9]undecane, tricyclo[5.3.2.0.4,9]dodecane, and tricyclo[5.2.1.0.2,6]decane. As mentioned herein the cyclic alkyl groups may have any of the acyclic alkyl groups as substituents.

Alkylene groups are divalent alkyl groups derived from any of the alkyl groups mentioned hereinabove. When referring to alkylene groups, these include an alkylene chain substituted with ($C_1$-$C_6$) alkyl groups in the main carbon chain of the alkylene group. Alkylene groups can also include one or more alkyne or alkene groups in the alkylene moiety, where alkyne refers to a triple bond and alkene refers to double bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-2,5-hexene, 2,5-dimethyl-2,5-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above.

Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like.

Alkoxy means straight or branched chain alkoxy having 1 to 20 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy.

Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

Alkylenearyl means an aliphatic alkylene moeity with pendant aryl groups. Examples are 1-phenyl-1,2-ethylene and 1-phenylpropylene.

Furthermore, and as used herein, the term "substituted" is contemplated to include all permissible substituents of organic compounds. In a broad aspect, the permissible substituents include acyclic and cyclic, branched and unbranched, carbocyclic and heterocyclic, aromatic and non-aromatic substituents of organic compounds. Illustrative substituents include, for example, those described hereinabove. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

Halogen refers to fluorine, chlorine and bromine, although fluorine and chlorine are preferred.

The moiety Y' is derived from the diol or similar compounds to form the polymer. Y' may be exemplified by ($C_1$-$C_{20}$) substituted or unsubstituted alkylene, substituted or unsubstituted thia-alkylene aliphatic ($C_1$-$C_{20}$) group, substituted or unsubstituted cycloalkylene, substituted or unsubstituted benzyl, alkoxy alkylene, alkoxyaryl, alkyleneester substituted with an absorbing chromophore such as phenyl, naphthyl or anthracyl, substituted aryl, hetero cycloalkylene, heteroalkyl, heteroaryl, oxocyclohexyl, cyclic lactone, benzyl, substituted benzyl, hydroxy alkyl, hydroxyalkoxyl, alkoxy alkyl, alkoxyaryl, alkylenearyl, alkylaryl, alkenyl, substituted aryl, alkylenearylate, hetero cycloalkyl, heteroaryl, nitroalkyl, haloalkyl, alkylimide, alkyl amide and mixtures thereof. More specific examples are methylene (—$CH_2$—), ethylene ($CH_2CH_2$). propylene, butylene, 1-phenyl-1,2-ethylene, neopentylene, ethylenephenylate, 2-bromo-2-nitro-1,3-propylene, 2-bromo-2-methyl-1,3-propylene, polyethyleneglycol, 1-phenylate-1,2-ethylene, 1-benzylate-1,2-ethylene, —$CH_2OCH_2$—, —$CH_2CH_2OCH_2CH_2$—, —$CH_2CH_2SCH_2CH_2$—, or —$CH_2CH_2SCH_2CH_2SCH_2CH_2$—, phenyl derivative, naphthyl derivative, anthracyl derivatives, propylenephenyl acetate, 2-propylenephenyl acetate —$CH_2CH(CH_2CO_2CH_2Ph)$-, propylene phenyl ether —$CH_2CH(CH_2OPh)$-, propylene phenolate —$CH_2CH(CH_2CO_2Ph)$-, ($CH_3OCO)CHCH(COOCH_3$)—, propylene naphthoate, propylenephthalimide, propylenesuccinimide, propylene crotylidene acetate (—$CH_2CH_2(CH_2CO_2CHCHCHCHCH_3)$). Some of the monomers which may be used to synthesize the polymer of the present invention and which can represent the Y' component are, preferably, diols, and glycols, examples of which are, ethylene glycol, diethylene glycol, propylene glycol, 1-phenyl-1,2-ethanediol, 2-bromo-2-nitro-1,3-propane diol, 2-methyl-2-nitro-1,3-propanediol, diethylbis(hydroxymethyl)malonate, and 3,6-dithia-1,8-octanediol. Examples of aromatic diols are 2,6-bis(hydroxymethyl)-p-cresol and 2,2'-(1,2-phenylenedioxy)-diethanol, 1,4-benzenedimethanol, dialkyl tartrate, 1-phenylate-1,2-ethanediol derived from the reaction of phenylacetic acid and glycidol, reaction product of glycidol and phenol, reaction product of glycidol and benzoic acid, reaction product of glycidol and naphthoic acid, reaction product of glycidol andanthracene carboxylic acid. Others are reaction product of glycidol and phthalimide, reaction product of glycidol and succinimide, and reaction product of glycidol and sorbic acid.

The polymer of the present invention has at least one of the pendant carboxyl groups derived from the dianhydride present as capped with a capping group. In one embodiment of the polymer at least one of R' and R" is represented by structure 2. L is represented by an organic group which may be hydrocarbyl group. The hydrocarbyl group is like the one as described previously and exemplified by substituted or unsubstituted aliphatic ($C_1$-$C_{20}$) alkyl group, substituted or unsubstituted aliphatic ($C_1$-$C_{20}$) cycloalkyl group, substituted or unsubstituted aliphatic ($C_1$-$C_{20}$) aryl group, and substituted or unsubstituted aliphatic ($C_1$-$C_{20}$) alkylenearyl group. The hydrocarbyl group may also comprise fluorinated alkyl groups. Other examples of L are ethyleneglycidyl, butyleneglycidyl, poly(ethylene)glycidyl, poly(propylene)glycidyl, glycerolglycidyl, etc. The substituted or unsubstituted alkyl group may comprise unsaturated bonds. The substituted or unsubstituted cycloalkyl group may comprise unsaturated bonds. The structure (2) of R' may be exemplified by for example alkyletherhydroxyalkylene, phenyletherhydroxyalkylene, methoxy propanol, ethoxy propanol, propoxy propanol, butoxy propanol, methoxy butanol, ethoxy butanol, propoxy butanol, allyl propanol ether, benzyl propanol ether, benzyl butanol ether, phenyl propanol ether, tetrafluoropropyl propanol ether, tertafluoroethyl propanol ether, octafluoropentyl propanol ether and the like. Examples of the hydroxyl-forming compound useful for reacting with the carboxylic acid, where the carboxylic acid group is derived from the dianhydride, and forming the group R", include aromatic oxide, aliphatic oxide, alkylene carbonate, aliphalic glycidyl ether, aromatic glycidyl ether, epoxycyanurate group, fluorinated glycidyl ether, etc and can be further exemplified by styrene oxide, propylene oxide, ethylene carbonate and the like. Examples of aromatic oxides include: styrene oxide, 1,2-epoxy-phenoxypropane, glycidyl-2-methylphenyl ether, (2,3-epoxypropyl)benzene, 1-phenylpropylene oxide, stilbene oxide, 2-(or 3- or 4-)halo(chloro, fluoro, bromo, iodo) stilbene oxide, benzyl glycidyl ether, $C_{1-10}$ straight or branched chain alkyl(e.g., methyl, ethyl, propyl, butyl, sec-butyl, tert-butyl, pentyl, hexyl, heptyl, and the like etc)phenyl glycidyl ether, 4-halo(chloro, fluoro, bromo, iodo)phenyl glycidyl ether, glycidyl 4-$C_{1-10}$ straight or branched chain alkoxy(e.g., methoxy, ethoxy, propoxy, butoxy, hexyloxy, heptyloxy, and the like etc)phenyl ether, 2,6-dihalo(chloro, fluoro, bromo, iodo)benzylmethyl ether, 3,4-dibenzyloxybenzyl halide (chloride, fluoride, bromide, iodide), 2-(or 4-)methoxybiphenyl, 3,3'-(or 4,4'-)di$C_{1-10}$ straight or branched chain alkoxy(e.g., methoxy, ethoxy, propoxy, butoxy, hexyloxy, heptyloxy, and the like etc)biphenyl, 4,4'-dimethoxyoctafluorobiphenyl, 1-(or 2-)$C_{1-10}$ straight or branched chain alkoxy(e.g., methoxy, ethoxy, propoxy, butoxy, hexyloxy, heptyloxy, and the like etc)naphthalene, 2-halo(chloro, fluoro, bromo, iodo)-6-methoxynaphthalene, 2,6-di$C_{1-10}$ straight or branched chain alkoxy(e.g., methoxy, ethoxy, propoxy, butoxy, hexyloxy, heptyloxy, and the like etc)naphthalene, 2,7-di$C_{1-10}$ straight or branched chain alkoxy(e.g., methoxy, ethoxy, propoxy, butoxy, hexyloxy, heptyloxy, and the like etc)naphthalene, 1,2,3,4,5,6-hexahalo(chloro, fluoro, bromo, iodo)-7-$C_{1-10}$ straight or branched chain alkoxy(e.g., methoxy, ethoxy, propoxy, butoxy, hexyloxy, heptyloxy, and the like etc)naphthalene, 9,10-bis(4-$C_{1-10}$ straight or branched chain alkoxy(e.g., methoxy, ethoxy, propoxy, butoxy, hexyloxy, heptyloxy, and the like etc)phenyl)-anthracene, 2-$C_{1-10}$ straight or branched chain alkyl(e.g., methyl, ethyl, propyl, butyl, sec-butyl, tert-butyl, pentyl, hexyl, heptyl, and the like etc)-9,10-di$C_{1-10}$ straight or branched chain alkoxy(e.g., methoxy, ethoxy, propoxy, butoxy, hexyloxy, heptyloxy, and the like etc)anthracene, 9,10-bis(4-$C_{1-10}$ straight or branched chain alkoxy(e.g., methoxy, ethoxy, propoxy, butoxy, hexyloxy, heptyloxy, and the like etc)phenyl)-2-halo(chloro, fluoro, bromo, iodo)-anthracene, 2,3,6,7,10,11-hexamethoxytriphenylene, glycidyl-3-(pentadecadienyl)phenyl ether, 4-t-butylphenylglycidyl ether, triphenylolmethane triglycidyl ether, [(4-(1-heptyl-8-[3-(oxiranylmethoxy)phenyl]-octyl)phenoxy)methyl]oxirane, tetraphenylolethane tetraglycidyl ether, hydroxyphenol diglycidyl ether, etc. Examples of aliphatic oxides include ethylene oxide, propylene oxide, butylene oxides, including isobutylene oxide, 1,2-butylene oxide and 2,3-butylene oxide, pentylene oxide, cyclohexene oxide, methyl glycidyl ether, ethyl glycidyl ether, isopropyl glycidyl ether, propyl glycidyl ether, butyl glycidyl ether, decyl glycidyl ether, and dodecyl glycidyl ether, allyl glycidyl ether, glycidyl 1,1,2,2-tetrafluoroethyl ether, glycidyl 2,2,3,3-tetrafluoropropyl ether, glycidyl 2,2,3,3,4,4,5,5-octafluoropentyl ether. Examples of alkylene carbonates include those compounds having the formula

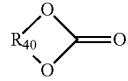

where $R_{40}$ is $C_2$-$C_4$ alkyl where the aliphatic ring carbons are unsubstituted or substituted with a group selected from $C_1$-$C_{10}$ alkyl, $C_6$-$C_{10}$ aryl, or $C_6$-$C_{15}$ aralkyl group. Examples of alkylene carbonates are ethylene carbonate, propylene carbonate, and butylene carbonates.

More specifically R' and R" can be derived by reacting the free acid in the polyester made with a dianhydride and a polyol with compounds such as ethylene glycol diglycidylether, butanediol diglycidyl ether, poly(ethylene glycol diglycidyl ether, poly(propylene glycol diglycidyl ether, trimethylolpropane triglycidyl ether, triphenylolmethane triglycidyl ether, triphenylolmethane triglycidyl ether 2,6-tolylene diisocyanate adduct, glycerol propoxylate triglycidyl ether, tris(2,3-epoxypropyl) isocyanurate, glycerol diglycidyl ether. Further example of R" are epoxide groups, G as shown in FIG. 6, attached to the polymer of FIGS. 4 and 5.

The polymers of this invention may be prepared by any of the standard polymerization methods known in the art, especially condensation polymerization techniques. The polymer may be synthesized using solution, emulsion, bulk, suspension polymerization, or the like. Typically a dianhydride is condensed with a diol or a similar compound, at elevated temperatures, and optionally in the presence of an acid, to give a polyester. The polyester polymer may be reacted further to modify the substituents in the polymer. The resulting carboxylic acid substituent derived from the dianhydride may be in the free acid form, may be reacted to give an ester, or be attached to another polymer chain, or be mixtures of these or other substituents. In one embodiment the free carboxylic acid is reacted to form an ester. In another embodiment the acid group in the polymer is partially esterified. In yet another embodiment the polymer is fully esterified, that is, the polymer does not contain any free acid.

The diols are typically condensed with at least one aliphatic dianhydride. Typically a linear polyester is first prepared by the reaction of a dianhydride and a diol in a suitable solvent. The polymer may be obtained by reacting one dianhydride and one diol or by reacting mixtures of different dianhydrides and/or diols, where at least one dianhydride is an aliphatic dianhydride. The polyester is isolated by precipitation into a non-solvent. The polyester may be further modified by reacting the free carboxylic acid groups with capping compounds such as alcohols, alkene oxide or carbonates. The reaction of the polyester with the capping compound may be done prior to isolation of the polymer or after the isolation of the polymer. The final polymer may be isolated and dried.

In one embodiment the polymer of the present composition is partially crosslinked to increase the molecular weight. Once the polymer is synthesized the polymer may be reacted further with a compound which comprises a group or groups capable of crosslinking the polymer, or crosslinked using a crosslinking agent, such as those taught in the present application. Crosslinking of the polymer may be facilitated by techniques well know to those skilled in the art, for example by heating and/or catalysis. The extent of crosslinking is determined by the desired physical and chemical properties of the polymer. The crosslinked polymer is then formulated into an antireflective coating composition of the present invention.

The weight average molecular weight of the polymer may range from about 1500 to about 180,000, preferably from about 4,000 to about 60,000 and more preferably from about 10,000 to about 30,000.

The antireflective coating composition comprises a polymer, a crosslinking agent, an acid generator, and a solvent composition.

A variety of crosslinking agents can be used in the composition of the present invention. Any suitable crosslinking agents that can crosslink the polymer in the presence of an acid may be used. Examples, without limitation, of such crosslinking agents are resins containing melamines, methylols, glycoluril, polymeric glycolurils, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6 bishydroxymethyl p-cresol may be used. Crosslinking agents disclosed in US 2006/0058468 and incorporated herein by reference, where the crosslinking agent is a polymer obtained by reacting at least one glycoluril compound with at least one reactive compound containing at least one hydroxy group and/or at least one acid group may be used.

The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. The photoresist film is heated for a sufficient length of time to react with the coating. Examples of thermal acid generators are metal-free iodonium and sulfonium salts. Other examples of TAGs are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid. Iodonium salts can be exemplified by iodonium fluorosulfonates, iodonium tris(fluorosulfonyl)methide, iodonium bis(fluorosulfonyl)methide, iodonium bis(fluorosulfonyl)imide, iodonium quaternary ammonium fluorosulfonate, iodonium quaternary ammonium tris(fluorosulfonyl) methide, and iodonium quaternary ammonium bis (fluorosulfonyl)imide. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further contain a photoacid generator, examples of which without limitation, are onium salts, sulfonate compounds, nitrobenzyl esters, triazines, etc. The preferred photoacid generators are onium salts and sulfonate esters of hydroxyimides, specifically diphenyl iodnium salts, triphenyl sulfonium salts, dialkyl iodonium salts, triakylsulfonium salts, and mixtures thereof.

The amount of the polymer in the present composition can vary from about 95 weight % to about 50 weight %, preferably about 85 weight % to about 70 weight % and more preferably about 80 weight % to about 70 weight %, relative to the solid portion of the composition. The amount of the crosslinker in the present composition can vary from 5 weight % to about 50 weight %, preferably 15 weight % to about 30 weight % relative to the solid portion of the composition. The amount of the acid generator in the present composition can vary from 0.1 weight % to about 5 weight %, preferably 0.5 weight % to about 3 weight % and more preferably 1 weight % to about 2 weight %, relative to the solid portion of the composition.

Typical solvents, used as mixtures or alone, that can be used for the present composition, without limitation, are propylene glycol monomethyl ether acetate (PGMEA), propylene gycol monomethyl ether (PGME), and ethyl lactate (EL), 2-heptanone, cyclopentanone, cyclohexanone, and gamma butyrolactone, but PGME, PGMEA and EL or mixtures thereof are preferred. Solvents with a lower degree of toxicity, good coating and solubility properties are generally preferred.

The antireflective coating composition comprises the copolymer, crosslinker and acid generator of the instant invention and a suitable solvent or mixtures of solvents. Other components may be added to enhance the performance of the coating, e.g. monomeric dyes, lower alcohols, surface leveling agents, adhesion promoters, antifoaming agents, etc. Other polymers, such as, novolaks, polyhydroxystyrene, polymethylmethacrylate and polyarylates, may be added to the composition, providing the performance is not negatively impacted. Preferably the amount of this polymer is kept below 50 weight % of the total solids of the composition, more preferably 20 weight %, and even more preferably below 10 weight %.

The optical characteristics of the antireflective coating are optimized for the exposure wavelength and other desired lithographic characteristics. As an example the absorption parameter (k) of the novel composition for 193 nm exposure ranges from about 0.1 to about 1.0, preferably from about 0.2 to about 0.75, more preferably from about 0.25 to about 0.65 as measured using ellipsometry. The value of the refractive index (n) ranges from about 1.25 to about 2.5, preferably from about 1.3 to about 2.0, and more preferably from about 1.5 to about 2.0. Due to the good absorption characteristics of this composition at 193 nm, very thin antireflective films of the order of about 40 nm may be used. This is particularly advantageous when using a nonaromatic photoresist, such as those sensitive at 193 nm, 157 nm and lower wavelengths, where the photoresist films are thin and must act as an etch mask for the antireflective film. Since the antireflective film is coated on top of the substrate and is further subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The antireflective coating composition is coated on the substrate using techniques well known to those skilled in the art, such as dipping, spin coating or spraying. The film thickness of the antireflective coating ranges from about 15 nm to about 200 nm. The coating is further heated on a hot plate or convection oven for a sufficient length of time to remove any residual solvent and induce crosslinking, and thus insolubilizing the antireflective coating to prevent intermixing between the antireflective coatings. The preferred range of temperature is from about 90° C. to about 250° C. If the temperature is below 90° C. then insufficient loss of solvent or insufficient amount of crosslinking takes place, and at temperatures above 300° C. the composition may become chemically unstable. A film of photoresist is then coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, silicon, silicon substrate coated with a metal surface, copper coated silicon wafer, copper, substrate coated with antireflective coating, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure below 200 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al Advances in Resist Technology and Processing XIX, Proceedings of SPIE Vol. 4690 p 76 2002; U.S. Pat. No. 6,818,258) or copolymerization of a fluorodiene with an olefin ((U.S. Pat. No. 6,916,590). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide. The developer may further comprise surfactant(s). An optional heating step can be incorporated into the process prior to development and after exposure.

The process of coating and imaging photoresists is well known to those skilled in the art and is optimized for the specific type of resist used. The patterned substrate can then be dry etched with an etching gas or mixture of gases, in a suitable etch chamber to remove the exposed portions of the antireflective film, with the remaining photoresist acting as an etch mask. Various etching gases are known in the art for etching organic antireflective coatings, such as those comprising $CF_4$, $CF_4/O_2$, $CF_4/CHF_3$, $O_2$ or $Cl_2/O_2$.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE™ 302 ellipsometer.

The molecular weight of the polymers was measured on a Gel Permeation Chromatograph.

Synthesis Example 1

10 g of butanetetracarboxylic acid dianhydride, 7 g of styrene glycol, 0.5 g of benzyltributylammonium chloride, and 50 g of propyleneglycol monomethyletheracetate (PGMEA) were charged into a flask with a condenser, thermal controller and a mechanical stirrer. Under nitrogen and stirring, the mixture was heated to 110° C. A clear solution was obtained after about 1-2 hours. The temperature was kept at 110° C. for 4 hrs. Upon cooling, 30 g of PGMEA and 8.8 g of isopropyl glycidyl ether and 3.6 g styrene oxide were mixed with the above solution. The reaction was kept at 125° C. for 24 hrs. The reaction solution was cooled to room temperature and slowly poured into a large amount of water in a high speed blender. The polymer was collected and washed thoroughly with water. Finally the polymer was dried in a vacuum oven. 22 g of polymer was obtained with a weight average molecular weight (MW) of about 17,000 g/mol.

Synthesis Example 2

10 g of butanetetracarboxylic acid dianhydride, 7 g of styrene glycol, 0.5 g of benzyltributylammonium chloride, and 50 g of propyleneglycol monomethyletheracetate (PGMEA) were charged into a flask with a condenser, thermal controller and a mechanical stirrer. Under nitrogen and stirring, the mixture was heated to 110° C. A clear solution was obtained after about 1-2 hr. The temperature was kept at 110° C. for 4 hrs. 9.4 g of isopropyl glycidyl ether was added with 10 g of PGMEA in the above solution. The reaction was kept at 110° C. for 16 hrs. The reaction solution was cooled down and 12 g of tris (2,3-epoxypropyl) isocyanurate with 30 g of acetonitrile were added in the mixture. The reaction was allowed at 68° C. for 24 hrs. The mixture was slowly poured into large amount of water in a high speed blender. The polymer was collected and air dried. The crude product was redissolved in acetone and precipitated in DI water. The polymer was washed thoroughly with water and was dried in a vacuum oven. 25 g of polymer was obtained with a weight average molecular weight (MW) of about 17,000 g/mol.

Synthesis Example 3

10 g of butanetetracarboxylic acid dianhydride, 10 g of (+)-dimethyl L-tartrate, 0.5 g of benzyltributylammonium chloride, and 50 g of propyleneglycol monomethyletheracetate (PGMEA) were charged into a flask with a condenser, thermal controller and a mechanical stirrer. Under nitrogen and stirring, the mixture was heated to 110° C. A clear solution was obtained after about 1-2 hours. The temperature was kept at 110° C. for 4 hrs. Upon cooling, 30 g of PGMEA and 4.2 g of isopropyl glycidyl ether and 8.5 g styrene oxide were mixed with the above solution. The reaction was kept at 120° C. for 24 hrs. The reaction solution was cooled to room temperature and slowly poured into a large amount of water in a high speed blender. The polymer was collected and washed thoroughly with water. Finally the polymer was dried in a vacuum oven. 23 g of polymer was obtained with a weight average molecular weight (MW) of about 15,000 g/mol.

Synthesis Example 4

10 g of butanetetracarboxylic acid dianhydride, 7 g of styrene glycol, 0.5 g of benzyltributylammonium chloride, and 50 g of propyleneglycol monomethyletheracetate (PGMEA) were charged into a flask with a condenser, thermal controller and a mechanical stirrer. Under nitrogen and stirring, the mixture was heated to 110° C. A clear solution was obtained after about 1-2 hr. The temperature was kept at 110° C. for 4 hrs. Upon cooling, 30 g of PGMEA and 8.8 g of isopropyl glycidyl ether and 4.0 g (2,3-epoxypropyl)benzene were mixed with the above solution. The reaction was kept at 120° C. for 24 hrs. The reaction solution was cooled to room temperature and slowly poured into a large amount of water in a high speed blender. The polymer is redissoved in acetonitrile and precipitated in water. The polymer was collected and washed thoroughly with water. Finally the polymer was dried in a vacuum oven. 16 g of polymer was obtained with a weight average molecular weight (MW) of about 13,000 g/mol.

Synthesis Example 5

10 g of butanetetracarboxylic acid dianhydride, 7 g of styrene glycol, 0.5 g of benzyltributylammonium chloride, and 50 g of propyleneglycol monomethyletheracetate (PGMEA) were charged into a flask with a condenser, thermal controller and a mechanical stirrer. Under nitrogen and stirring, the mixture was heated to 110° C. A clear solution was obtained after about 1-2 hr. The temperature was kept at 110° C. for 4 hrs. Upon cooling, 40 g of PGMEA and 17 g of benzyl glycidyl ether were mixed with the above solution. The reaction was kept at 125° C. for 24 hrs. The reaction solution was cooled to room temperature and slowly poured into a large amount of water in a high speed blender. The polymer is redissoved in acetonitrile and precipitated in water. The polymer was collected and washed thoroughly with water. Finally the polymer was dried in a vacuum oven. 20 g of polymer was obtained with a weight average molecular weight (MW) of about 17,000 g/mol.

Synthesis Example 6

600 grams of tetramethoxymethyl glycoluril, 96 grams of styrene glycol and 1200 grams of PGMEA were charged into a 2 L jacketed flask with a thermometer, mechanical stirrer and a cold water condenser and heated to 85° C. After a catalytic amount of para-toluenesulfonic acid monohydrate was added, the reaction was maintained at this temperature for 5 hrs. The reaction solution was then cooled to room temperature and filtered. The filtrate was slowly poured into distilled water while stirring to precipitate the polymer. The polymer was filtered, washed thoroughly with water and dried in a vacuum oven (250 grams were obtained). The polymer obtained had a weight average molecular weight of about 17,345 g/mol and a polydispersity of 2.7.

Synthesis Example 7

1000 grams of tetramethoxymethyl glycoluril, 500 grams of neopentyl glycol and 3000 grams of PGMEA were charged into a 5000 mL flask with a thermometer, a cold water condenser and a mechanical stirrer. The reaction mixture was heated to 85° C. After a catalytic amount of para-toluenesulfonic acid monohydrate was added, the reaction was maintained at this temperature for 8.0 hours. The reaction solution was then cooled to room temperature and filtered. The polymer was precipitated in DI water and collected on a filter, washed thoroughly with water and dried in a vacuum oven (400 grams were obtained). The polymer obtained had a weight average molecular weight of about 8,000 g/mol and a polydispersity of 3.

Example 8

1.0 of polymer solid from Synthesis Example 1 was dissolved in 30.0 g of PGMEA/PGME (70:30) to make a 3.3 wt % solution. 0.1 g of tetrakis (methoxymethyl)glycoluril (MX-270 available from Sanwa Chemicals, Hiratsuka, Japan), 0.1 g of a 10% solution of dodecylbenzene sulfonic acid triethylamine salt in ethyl lactate was added in the polymer solution. The mixture then was filtered through a micro filter with a pore size of 0.2 pm. The solution was then coated on a silicon wafer and baked at 200° C. for 90 seconds. The antireflective film was found to have (n) value of 1.84 and (k) value of 0.46 at 193 nm.

Example 9

1 g of polymer solid from Synthesis Example 2 was dissolved in 30.0 g of PGMEA/PGME (70:30) solvent to make a 3.3 wt % solution. 0.1 g of a 10% solution of dodecylbenzene sulfonic acid triethylamine salt in ethyl lactate was added in the polymer solution. The mixture then was filtered through a micro filter with a pore size of 0.2 μm. The solution was then coated on a silicon wafer and baked at 200° C. for 90 seconds. The antireflective film was found to have (n) value of 1.83 and (k) value of 0.34 at 193 nm.

Example 10

1.0 of polymer solid from Synthesis Example 3 was dissolved in 30.0 g of PGMEA/PGME (70:30) to make a 3.3 wt % solution. 0.1 g of tetrakis (methoxymethyl)glycoluril (MX-270 available from Sanwa Chemicals, Hiratsuka, Japan), 0.1 g of a 10% solution of dodecylbenzene sulfonic acid triethylamine salt in ethyl lactate was added in the polymer solution. The mixture then was filtered through a micro filter with a pore size of 0.2 μm. The solution was then coated on a silicon wafer and baked at 200° C. for 90 seconds. The antireflective film was found to have (n) value of 1.84 and (k) value of 0.39 at 193 nm.

Example 11

1.0 of polymer solid from Synthesis Example 4 was dissolved in 30.0 g of PGMEA/PGME (70:30) to make a 3.3 wt % solution. 0.1 g of tetrakis (methoxymethyl)glycoluril (MX-270 available from Sanwa Chemicals, Hiratsuka, Japan), 0.1 g of a 10% solution of dodecylbenzene sulfonic acid triethylamine salt in ethyl lactate was added in the polymer solution. The mixture then was filtered through a micro filter with a pore size of 0.2 μm. The solution was then coated on a silicon wafer and baked at 200° C. for 90 seconds. The antireflective film was found to have (n) value of 1.82 and (k) value of 0.48 at 193 nm.

Example 12

1.0 of polymer solid from Synthesis Example 5 was dissolved in 30.0 g of PGMEA/PGME (70:30) to make a 3.3 wt % solution. 0.1 g of tetrakis (methoxymethyl)glycoluril (MX-270 available from Sanwa Chemicals, Hiratsuka, Japan), 0.1 g of a 10% solution of dodecylbenzene sulfonic acid triethylamine salt in ethyl lactate was added in the polymer solution. The mixture then was filtered through a micro filter with a pore size of 0.2 μm. The solution was then coated on a silicon wafer and baked at 200° C. for 90 seconds. The antireflective film was found to have (n) value of 1.82 and (k) value of 0.66 at 193 nm.

Example 13

0.6 g of polymer solid from Synthesis Example 1 and 0.4 g of polymer solid from Synthesis Example 7 was dissolved in 30.0 g of PGMEA/PGME (70:30) to make a 3.3 wt % solution. 0.1 g of a 10% solution of dodecylbenzene sulfonic acid triethylamine salt in ethyl lactate was added in the polymer solution. The mixture then was filtered through a micro filter with a pore size of 0.2 μm. The solution was then coated on a silicon wafer and baked at 200° C. for 90 seconds. The antireflective film was found to have (n) value of 1.86 and (k) value of 0.35 at 193 nm.

Example 14

0.7 g of polymer solid from Synthesis Example 1 and 0.3 g of polymer solid from Synthesis Example 6 was dissolved in 30.0 g of PGMEA/PGME (70:30) to make a 3.3 wt % solution. 0.1 g of a 10% solution of dodecylbenzene sulfonic acid triethylamine salt in ethyl lactate was added in the polymer solution. The mixture then was filtered through a micro filter with a pore size of 0.2 μm. The solution was then coated on a silicon wafer and baked at 200° C. for 90 seconds. The antireflective film was found to have (n) value of 1.88 and (k) value of 0.38 at 193 nm.

Example 15

A via filling composition was prepared by dissolving 5 g of the polymer prepared in Synthesis Example 2 and 0.5 g of a 10% solution of dodecylbenzene sulfonic acid triethylamine salt in 45 g of PGMEA/PGME (70:30) solvent. The solution was filtered through 0.2 μm filter. The filling performance of the formulation was evaluated with a substrate with via patterned in it. The solution was spin coated onto the substrate and baked at 200° C. to 225° C. for 90 seconds. The via sizes ranged from 130 nm to 300 nm in diameter, 650 nm in depth, and pitch ranged from 1:1 to isolated via. Good filling of the via and no voids were observed with cross-section scanning electron microscope (SEM).

Example 16

A via filling composition was prepared by dissolving 3.5 g of the polymer prepared in Synthesis Example 1, 1.5 g of the polymer prepared in Synthesis Example 6 and 0.5 g of a 10% solution of dodecylbenzene sulfonic acid triethylamine salt in 45 g of PGMEA/PGME (70:30) solvent. The solution was filtered through 0.2 μm filter. The filling performance of the formulation was evaluated with a substrate with vias patterned in it. The solution was spin coated onto the substrate and baked at 200° C. to 225° C. for 90 seconds. The via sizes ranged from 130 nm to 300 nm in diameter, 650 nm in depth, and pitch ranged from 1:1 to isolated vias. Good filling of the via and no voids were observed with cross-section SEM.

Lithographic Evaluation Example 17

The lithographic performance of the anti-reflective coating formulation was evaluated using AZ® ArF 3110P (a 193 nm photoresist, available from AZ Electronic Materials, Somerville, N.J.) photoresist. An antireflective film from Example 9 was coated on a 78 nm film of AZ® ArF-1C5D BARC (available from AZ Electronic Materials, Somerville, N.J.) on a silicon wafer and baked at 200° C. for 90 seconds. The film thickness of the antireflective coating is about 18 nm. Using AZ® ArF 3110P photoresist a 150 nm film was coated and baked at 100° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns of 80.nm were resolved and when observed under scanning electron microscope showed no standing waves, thus indicating the efficacy of the bottom anti-reflective coating.

Lithographic Evaluation Example 18

The lithographic performance of the anti-reflective coating formulation was evaluated using AZ® ArF 2110P photoresist (a 193 nm photoresist, available from AZ Electronic Materials, Somerville, N.J.). The solution of Example 13 was then coated on a silicon wafer and baked at 200° C. for 90 seconds. The film thickness of the antireflective coating is 80 nm. Using AZ® ArF 2110 photoresist a 190 nm film was coated and baked at 100° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns of 80 nm were resolved and when observed under scanning electron microscope showed no standing waves, thus indicating the efficacy of the bottom anti-reflective coating.

Lithographic Evaluation Example 19

The lithographic performance of the anti-reflective coating formulation was evaluated using AZ® ArF 2110P photoresist. The solution of Coating Formulation Example 14 was then coated on a silicon wafer and baked at 200° C. for 90 seconds. The film thickness of the antireflective coating is 80 nm. Using AZ® EXP 2110 photoresist a 190 nm film was coated and baked at 100° C. for 60 seconds. The wafer was then imagewise exposed using a 193 nm exposure tool. The exposed wafer was baked at 110° C. for 60 seconds and developed using a 2.38 wt % aqueous solution of tetramethyl ammonium hydroxide for 60 seconds. The line and space patterns of 80 nm were resolved and when observed under scanning electron microscope showed no standing waves, thus indicating the efficacy of the bottom anti-reflective coating.

The invention claimed is:

1. An antireflective coating composition for a photoresist layer comprising a polymer, a crosslinking agent and an acid generator, where the polymer comprises at least one unit of structure 1,

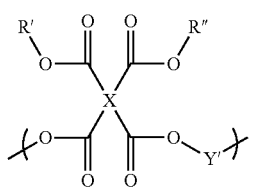

(1)

where, X is a linking moiety selected from a nonaromatic (A) moiety, aromatic (P) moiety and mixture thereof, R' is a group of structure 2, where $R_1$ and $R_2$ are H and L is a fluorinated alkyl, and further where structure 2 is

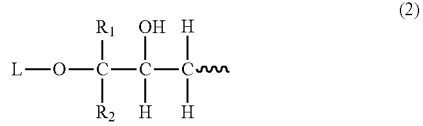

(2)

derived by capping a carboxyl group with fluorinated glycidyl ether capping reactant,
R" is independently selected from hydrogen or a group of structure 2, where $R_1$ and $R_2$ are hydrogen and L is a fluorinated alkyl, and further where structure 2 is derived by capping a carboxyl group with fluorinated glycidyl ether capping reactant and, Y' is independently a ($C_1$-$C_{20}$) hydrocarbylene linking moiety.

2. The composition of claim 1, where A is selected from a group consisting of $C_1$-$C_{20}$ unsubstituted alkylene, $C_1$-$C_{20}$ substituted alkylene, $C_1$-$C_{20}$ unsubstituted cycloaliphatic, $C_1$-$C_{20}$ substituted cycloaliphatic, and $C_1$-$C_{20}$ unsubstituted heterocycloaliphatic, and $C_1$-$C_{20}$ substituted heterocycloaliphatic moiety.

3. The composition of claim 1, where the polymer is of Structure 3,

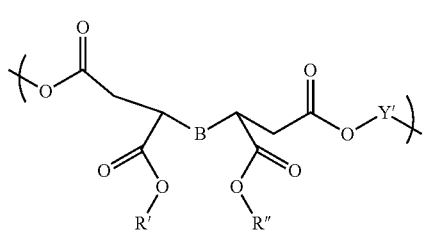

(3)

where, B is a single bond or $C_1$-$C_6$ nonaromatic aliphatic moiety, R' is a group of structure 2, where $R_1$ and $R_2$ are hydrogen, and L is a fluorinated alkyl, and further where structure 2 is derived by capping a carboxyl group with fluorinated glycidyl ether capping reactant and R" is independently selected from hydrogen or a group of structure 2, where $R_1$ and $R_2$ are hydrogen, and L is a fluorinated alkyl, and further where structure 2 is derived by capping a carboxyl group with fluorinated glycidyl ether capping reactant, and Y' is independently a ($C_1$-$C_{20}$) hydrocarbylene linking moiety.

4. The composition of claim 1 where Y' is selected from a group consisting of methylene, ethylene, propylene, butylene, phenylethylene, alkylnitroalkylene, neopentylene, alkylenearylate, dithiaoctylene, bromonitroalkylene, phenylene, naphthylene, anthracylene, derivatives of phenylene, derivatives of naphthylene, and derivatives of anthracylene.

5. The composition of claim 1, where Y' is selected from a group consisting of 1-phenyl-1,2-ethylene, neopentylene, ethylenephenylate, 2-bromo-2-nitro-1,3-propylene, 2-bromo-2-methyl-1,3-propylene, polyethyleneglycol, 1-phenylate-1 ,2-ethylene, 1-benzylate-1 ,2-ethylene, —$CH_2OCH_2$—, —$CH_2CH_2OCH_2CH_2$—, —$CH_2CH_2SCH_2CH_2$—, —$CH_2CH_2SCH_2CH_2SCH_2CH_2$—, propylenephenyl acetate, 2-propylenephenyl acetate (—$CH_2CH_2$ ($CH_2CO_2CH_2Ph$), propylene phenyl ether (—$CH_2CH_2$ ($CH_2OPh$), propylene phenolate (—$CH_2CH_2(CH_2CO_2Ph)$, propylene naphthoate, propylenephthalimide, propylenesuccinimide, and propylene crotylidene acetate (—$CH_2CH_2$ ($CH_2CO_2CHCHCHCHCH_3$).

6. The composition of claim 1, where the crosslinking agent is selected from a group consisting of melamines, methylols, glycolurils, polymeric glycolurils, hydroxy alkyl amides, epoxy and epoxy amine resins, blocked isocyanates, and divinyl monomers.

7. The composition of claim 1, where the acid generator is a thermal acid generator and is selected from a group consisting of alkyl ammonium salts of organic acids, phenolic sulfonate esters, nitrobenzyl tosylates, metal-free iodonium and metal-free sulfonium salts.

8. The composition of claim 1, where R' is a group of structure 2, where $R_1$ and $R_2$ are hydrogen and L is a fluorinated alkyl, and further where structure 2 is derived by capping a carboxyl group with capping reactant selected from a group consisting of glycidyl 1,1,2,2-tetrafluoroethyl ether, glycidyl 2,2,3,3-tetrafluoropropyl ether, and glycidyl 2,2,3,3,4,4,5,5-octafluoropentyl ether, and R" is independently selected from hydrogen or a group of structure (2), where $R_1$ and $R_2$ are hydrogen and L is a fluorinated alkyl, and further where structure 2 is derived by capping a carboxyl group with capping reactant selected from a group consisting of glycidyl 1,1,2,2-tetrafluoroethyl ether, glycidyl 2,2,3,3-tetrafluoropropyl ether, and glycidyl 2,2,3,3,4,4,5,5-octafluoropentyl ether.

9. An article comprising a substrate with a layer of antireflective coating composition of claim 1 and thereon a coating of photoresist comprising a polymer and a photoactive compound.

10. A process for forming an image comprising,
a) coating and baking a substrate with the antireflective coating composition of claim 1;
b) coating and baking a photoresist film on top of the antireflective coating;
c) imagewise exposing the photoresist to radiation;
d) developing an image in the photoresist;
e) optionally, baking the substrate after the exposing step.

11. The process of claim 10, where the photoresist is imagewise exposed at wavelengths between 130 nm to 250 nm.

12. The process of claim 10, where the photoresist comprises a polymer and a photoactive compound.

13. The process of claim 10, where the antireflective coating is baked at temperatures greater than 90° C.

14. The composition of claim 1, where the polymer is partially crosslinked polymer.

15. The composition of claim 1 where R' and R" are groups derived by capping a carboxyl group with a fluorinated glycidyl ether capping reactant selected from the group consisting of glycidyl 1,1,2,2-tetrafluoroethyl ether, glycidyl 2,2,3,3-tetrafluoropropyl ether, and glycidyl 2,2,3,3,4,4,5,5-octafluoropentyl ether.

* * * * *